United States Patent
Takahashi et al.

(10) Patent No.: US 6,792,570 B2
(45) Date of Patent: Sep. 14, 2004

(54) VITERBI DECODER WITH HIGH SPEED PROCESSING FUNCTION

(75) Inventors: Hideaki Takahashi, Tokyo (JP); Yoshiharu Yagi, Shizuoka (JP)

(73) Assignee: NEC Corporation, Tokyo (JP)

( * ) Notice: Subject to any disclaimer, the term of this patent is extended or adjusted under 35 U.S.C. 154(b) by 561 days.

(21) Appl. No.: 09/849,989

(22) Filed: May 8, 2001

(65) Prior Publication Data

US 2001/0044921 A1 Nov. 22, 2001

(30) Foreign Application Priority Data

May 12, 2000 (JP) ........................................ 2000-140830

(51) Int. Cl.[7] ............................................. H03M 13/41
(52) U.S. Cl. ....................... 714/795; 375/262; 704/242
(58) Field of Search ........................ 375/262; 704/242; 714/795

(56) References Cited

U.S. PATENT DOCUMENTS

| 5,375,129 | A | * | 12/1994 | Cooper ...................... 714/795 |
| 5,648,921 | A |   | 7/1997  | Araki et al. |
| 5,923,713 | A | * | 7/1999  | Hatakeyama ............... 714/795 |
| 5,938,788 | A | * | 8/1999  | Hayashi ...................... 714/794 |
| 5,946,361 | A | * | 8/1999  | Araki et al. ................ 714/795 |
| 5,982,822 | A | * | 11/1999 | Hatakeyama ............... 714/795 |
| 6,221,634 | B1|   | 4/2001  | Takeuchi et al. |
| 6,317,472 | B1| * | 11/2001 | Choi et al. .................. 714/795 |
| 6,385,258 | B1| * | 5/2002  | Ooya et al. ................. 714/795 |
| 6,473,472 | B1| * | 10/2002 | Uchiki et al. ............... 714/795 |
| 6,529,557 | B1| * | 3/2003  | Lee ............................ 714/795 |

FOREIGN PATENT DOCUMENTS

| EP | 0 677 928    | 10/1995 |
| EP | 1 102 408    | 5/2001  |
| GB | 2 335 578    | 9/1999  |
| JP | 8-16550      | 1/1996  |
| JP | 2798123      | 7/1998  |
| JP | 10-209882    | 8/1998  |
| JP | 11-186918    | 7/1999  |
| JP | 2000-210095  | 8/2000  |
| WO | WO 01/29974  | 4/2001  |

* cited by examiner

*Primary Examiner*—R. Stephen Dildine
(74) *Attorney, Agent, or Firm*—Foley & Lardner LLP

(57) ABSTRACT

A Viterbi decoder includes a path metric memory, a path memory, a branch metric generating section, an ACS (add compare and select) unit, a write section and a read section. The branch metric generating section generates branch metric data at times. The ACS unit calculates new path metric data from path metric data inputted thereto and the branch metric data at the times supplied from the branch metric generating section and determines path selection data for the new path metric data. The write section writes the new path metric data and the path selection data in the path metric memory and the path memory, respectively. The read section which reads out the path metric data from the path metric memory to output to the ACS unit.

11 Claims, 3 Drawing Sheets

VITERBI DECODER WITH HIGH SPEED PROCESSING FUNCTION

BACKGROUND OF THE INVENTION

1. Field of the Invention

The present invention relates to a Viterbi decoder which has a high speed processing function and low power consumption.

2. Description of the Related Art

A Viterbi decoder has been conventionally used to efficiently carry out the most likely decoding using the repetitive structure of convolution codes. A conventional Viterbi decoder carries out an ACS (add compare select) process in which branch metric data outputted from a branch metric generating section and path metric data read out from a path metric memory section are added to each other, and the addition results are compared with each other so as to select the smaller one as the path metric data. Then, the conventional Viterbi decoder carries out for the number of states, a process in which the path metric data is stored in the path metric memory and path selection data for the selected path metric data is stored in the path memory.

In the above conventional Viterbi decoder, when the ACS process is carried out, it is necessary to read out the path metric data from the path metric memory and to write the calculated path metric data in the path metric memory after the ACS process. Therefore, each of the read operation from the path metric memory and the write operation after the ACS process is carried out twice for one ACS process. In other words, the time sufficient to read two data from the path metric memory is required at the minimum for the one ACS process. Thus, there is a problem that it is not possible to speed up the ACS process any more.

Also, when a RAM is used as the path metric memory for the ACS process, the read operation from the path metric memory is carried out twice and the write operation is carried out twice after the process. Therefore, the number of times of access to the RAM is much so that power consumption is much compared with the processing amount.

In conjunction with the above description, a Viterbi decoding method is disclosed in Japanese Laid Open Patent Application (JP-A-Heisei 10-209882). In this reference, a branch metric calculation step, the branch metrics of the branches showing state transition from time n-1 to time n which are discrete are calculated over all of possible combinations of a transfer origin and a transfer destination. In an ACS step, the path metrics remaining at the time n-1 are read out from a path metric memory. The addition values of the read out path metric and the branch metric calculated in the branch metric calculation step are compared between paths to the transition destination for every transition destination. The minimum addition value obtained through the comparison is written into the path metric memory as a remaining path metric at the time n. The above ACS step is carried out in parallel for a plurality of paths to the different states at the time n-1 through the same state at the time n-1. Moreover, the above branch metric calculation step is carried out in parallel for a plurality of branches in which the transition origin is identical and the transition destination is different.

Also, a Viterbi decoder is disclosed in Japanese Laid Open Patent Application (JP-A-Heisei 11-186918). In this reference, a branch metric calculation section stores code words of a trellis chart of convolution coding previously, and inputs demodulation data in units of the coding blocks and calculates a distance between the inputted demodulation data and the code word of the trellis chart to determine a branch metric, and outputs the branch metric corresponding to path data which is branched from each state. The path metric memory section stores the path metric of a remaining path in each state at the time of a decoding operation in the last time, and outputs the path metric in synchronism with the output from the branch metric calculation section. The ACS section adds the branch metric outputted from the branch metric calculation section to the path metric outputted from the path metric memory section to determine updated path metric, compares the path metrics of the two paths which join at an optional state, and selects the path having a higher likelihood as the remaining path, and outputs the path metric and path data for the selected remaining path. A most likely path determining section selects a path having the highest likelihood from among the path metrics for remaining paths outputted from said ACS section in each state as the most likelihood path, and outputs a path number and the path metric of the most likelihood path. The normalizing operation section subtracts the path metric of the most likelihood path outputted from said most likelihood path determining section from the path metric in the remaining path in each state outputted from said ACS section for normalization, and outputs to a path metric memory section. The path memory section sequentially stores the path data of remaining path in each state outputted from said ACS section, and outputs the path data with the oldest path number as the decode data in accordance with the path number of the most likelihood path from said most likelihood path determining section. The ACS section divides the path metrics in each state outputted from the path metric memory section and the branch metrics of each branch outputted from the branch metric calculation section into a plurality of specific groups, converts the path metrics and the branch metrics into a serial sequence for every group, and adds the path metric and the branch metric for two paths which join at an optional state at time division timing to determine updated path metrics, respectively. The two updated path metrics are compared and the path having a higher likelihood is selected as the remaining path. The path metric and the path data for selected remaining path are converted into a parallel sequence for every group and outputted in an identical timing.

Also, a Viterbi decoding apparatus is disclosed in Japanese Patent No. 2,798,123. In this reference, the Viterbi decoding apparatus decodes a reception sequence which is subjected to convolution coding in the most likely manner based on a Viterbi algorithm. The branch metric calculation and normalization section calculates branch metrics and normalizes the calculated branch metrics such that the most likely value becomes the smallest. A branch metric memory section stores the normalized branch metrics outputted from the branch metric calculation and normalization section as a pair. A state metric memory section stores a state metric. An addition, comparison and selection section adds the branch metric pair read out from the branch metric memory section and the state metrics corresponding to the branch metric pair read out from the state metric memory section, respectively, and compares the addition results with each other. Moreover, the addition, comparison and selection section carries out the process for determining the most likely path based on the comparison result in parallel and collectively, and gets a new state metric to update the memory contents of the state metric memory section. The path memory section stores contents of the path obtained by the addition, comparison and selection section. The most likely decode judgment section carries out the decoding operation based on the memory contents of the path memory section. The branch metric memory section is composed of a write address generation section, a read address generation section, a switch and a branch metric output destination switching section. The writing address generation section is composed of a pair of memory sections for previously storing the branch metrics used by the addition, comparison and selection section for the calculation, and previously stores a pair of branch metrics in the same address of the pair of memory section. The read address generation section reads out the pair of branch metrics stored in the same address of the pair of memory sections in parallel. The switch is connected between the write address generation section, the read address generation section and the pair of memory sections to supply one of the write address and the read address on an address bus of the pair of memory sections. The branch metric output destination selection section changes the read out branch metrics from the pair of memory sections to the output of the branch metrics of a corresponding trellis.

SUMMARY OF THE INVENTION

An object of the present invention is to provide a Viterbi decoder in which the high peed processing and low power consumption can be achieved.

In an aspect of the present invention, a Viterbi decoder includes a path metric memory, a path memory, a branch metric generating section, an ACS (add compare and select) unit, a write section and a read section. The branch metric generating section generates branch metric data at times. The ACS (add compare and select) unit calculates new path metric data from path metric data inputted thereto and the branch metric data at the times supplied from the branch metric generating section and determines path selection data for the new path metric data. The write section writes the new path metric data and the path selection data in the path metric memory and the path memory, respectively. The read section which reads out the path metric data from the path metric memory to output to the ACS unit.

The ACS unit may input the path metric data, add the inputted path metric data and the branch metric data at one of the times supplied from the branch metric generating section to produce temporal addition results, select smaller one of the temporal addition results to latch the smaller temporal addition result as temporal path metric data, add the temporal path metric data and the branch metric data at the next time supplied from the branch metric generating section to produce addition results, select smaller one of the addition results, and latch and outputs the smaller addition result as the new path metric data and the path selection data for the new path metric data.

Also, the ACS unit may input the path metric data at a time T of the times and the branch metric data at the time T to calculate temporal path metric data at a time T+1 of the times, and calculate the new path metric data at a time T+2 of the times from the temporal path metric data at the time T+1 and the branch metric data at the time T+1.

In this case, the ACS unit may include a switch section, an adding section, a selecting section and a latch section. The switch section may select and output a first one of the path metric data at the time T and a first one of the temporal path metric data at the time T+1, select and outputs a second one of the path metric data at the time T and a second one of the temporal path metric data at the time T+1, select and outputs a third one of the path metric data at the time T and the first temporal path metric data at the time T+1, and select and outputs a fourth one of the path metric data at the time T and the second temporal path metric data at the time T+1. The adding section may add the first branch metric data at the time T and the first path metric data at the time T to produce a first addition result at the time T+1, add the first branch metric data at the time T+1 and the first temporal path metric data at the time T+1 to produce a first addition result at the time T+2, add the second branch metric data at the time T and the second path metric data at the time T to produce a second addition result at the time T+1, add the second branch metric data at the time T+1 and the second temporal path metric data at the time T+1 to produce a second addition result at the time T+2, add the third branch metric data at the time T and the third path metric data at the time T to produce a third addition result at the time T+1, add the third branch metric data at the time T+1 and the first temporal path metric data at the time T+1 to produce a third addition result at the time T+2, add the fourth branch metric data at the time T and the fourth path metric data at the time T to produce a fourth addition result at the time T+1, and add the fourth branch metric data at the time T+1 and the second temporal path metric data at the time T+1 to produce a fourth addition result at the time T+2. Also, the selecting section may select a first smaller one of the first and second addition results at the time T+1, select a second smaller one of the third and fourth addition results at the time T+1, and select a first smaller one of the first and second addition results at the time T+2 and output a first one of the path selection data for the first smaller addition result at the time T+2, select a second smaller one of the third and fourth addition results at the time T+2 and output a second one of the path selection data for the second smaller addition result at the time T+2. The latch section may latch the first smaller addition result at the time T+1 as the first temporal path metric data, and the second smaller addition result at the time T+1 as the second temporal path metric data, and latch the first smaller addition result at the time T+2 as a first one of the new path metric data, and the second smaller addition result at the time T+2 as a second one of the new path metric data.

In the above cases, the Viterbi decoder may further include a register and a subtracting section. The register latches the smallest one of elements of the new path metric data for states determined based on a restriction length. The subtracting section subtracts a value of the smallest element from each of elements of the path metric data read out from the path metric memory.

Also, the Viterbi decoder may further include a plurality of the ACS units. In this case, the writing section writes the new path metric data and the path selection data from each of the plurality of ACS units in the path metric memory and the path memory, respectively.

Also, in another aspect of the present invention, a method of Viterbi-decoding demodulation data, is attained by (a) generating branch metric data at times from demodulation data; by (b) calculating new path metric data from path metric data and the generated branch metric data at the times and determining path selection data for the new path metric data; by (c) writing the new path metric data and the path selection data in a path metric memory and a path memory, respectively; and by (d) reading out the path metric data from the path metric memory for the (b) calculating step of a next process.

The (b) calculating step may be attained by (e) adding the path metric data and the branch metric data at one of the times to produce temporal addition results; by (f) selecting smaller one of the temporal addition results to latch the smaller temporal addition result as temporal path metric data; by (g) adding the temporal path metric data and the branch metric data at the next time to produce addition results; by (h) selecting smaller one of the addition results; and by (i) latching the smaller addition result as the new path metric data and the path selection data for the new path metric data.

Also, the (b) calculating step may be attained by (j) calculating temporal path metric data at a time T+1 of the times from the path metric data at a time T of the times and the branch metric data at the time T; and by (k) calculating the new path metric data at a time T+2 of the times from the temporal path metric data at the time T+1 and the branch metric data at the time T+1.

In this case, the (j) calculating step may include the steps of: (l) selecting first one of the path metric data at the time T, second one of the path metric data at the time T, third one of the path metric data at the time T, and fourth one of the path metric data at the time T; (m) adding the first branch metric data at the time T and the first path metric data at the time T to produce a first addition result at the time T+1, adding the second branch metric data at the time T and the second path metric data at the time T to produce a second addition result at the time T+1, adding the third branch metric data at the time T and the third path metric data at the time T to produce a third addition result at the time T+1, and adding the fourth branch metric data at the time T and the fourth path metric data at the time T to produce a fourth addition result at the time T+1; (n) selecting a first smaller one of the first and second addition results at the time T+1, and selecting a second smaller one of the third and fourth addition results at the time T+1; and (o) latching the first smaller addition result at the time T+1 as the first one of the temporal path metric data, and the second smaller addition result at the time T+1 as the second one of the temporal path metric data.

Also, the (k) calculating step may include the steps of: (p) selecting a first one of the temporal path metric data at the time T+1, a second one of the temporal path metric data at the time T+1, the first temporal path metric data at the time T+1, and the second temporal path metric data at the time T+1; (q) adding the first branch metric data at the time T+1 and the first temporal path metric data at the time T+1 to produce a first addition result at the time T+2, adding the second branch metric data at the time T+1 and the second temporal path metric data at the time T+1 to produce a second addition result at the time T+2, adding the third branch metric data at the time T+1 and the first temporal path metric data at the time T+1 to produce a third addition result at the time T+2, and adding the fourth branch metric data at the time T+1 and the second temporal path metric data at the time T+1 to produce a fourth addition result at the time T+2; (r) selecting a first smaller one of the first and second addition results at the time T+2 and outputting a first one of the path selection data for the first smaller addition result at the time T+2, and selecting a second smaller one of the third and fourth addition results at the time T+2 and outputting a second one of the path selection data for the second smaller addition result at the time T+2; and (s) latching the first smaller addition result at the time T+2 as a first one of the new path metric data, and the second smaller addition result at the time T+2 as a second one of the new path metric data.

The method may further include (t) latching the smallest one of elements of the new path metric data for states determined based on a restriction length; and (u) subtracting a value of the smallest element from each of elements of the path metric data read out from the path metric memory.

Also, the (c) writing step may be attained by writing the new path metric data and the path selection data generated by a plurality of ACS units through the (b) calculating step in the path metric memory and the path memory, respectively.

DESCRIPTION OF THE PREFERRED EMBODIMENTS

Hereinafter, a Viterbi decoder of the present invention will be described in detail with reference to the attached drawings.

Figure 1:
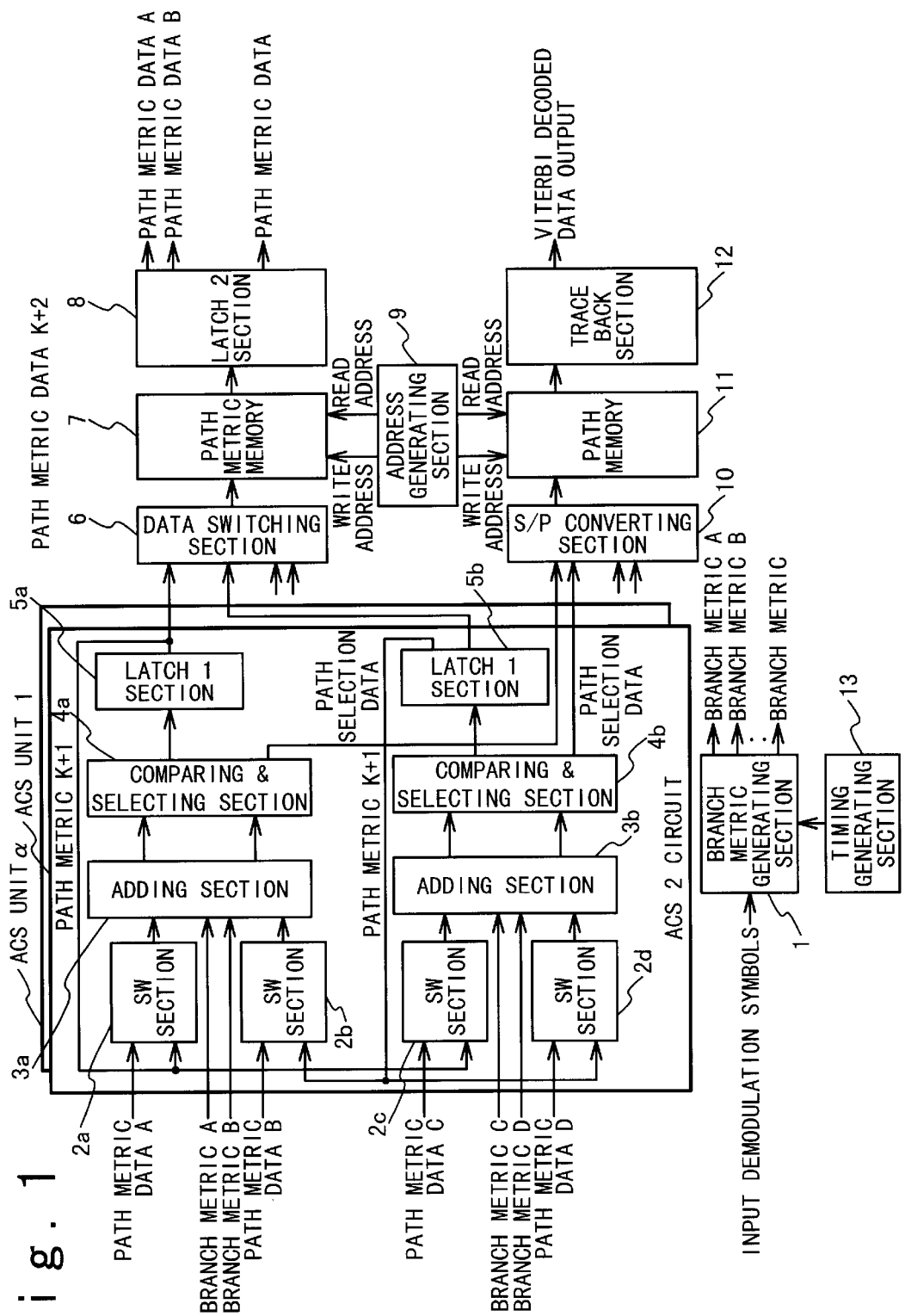
FIG. 1 is a block diagram showing the structure of a Viterbi decoder according to a first embodiment of the present invention.

FIG. 1 is a block diagram showing the Viterbi decoder according to the first embodiment of the present invention. In FIG. 1, a branch metric generating section 1 produces branch metric data for 2 symbols from inputted demodulation symbols. Switch (SW) sections 2a to 2d select which of path metric data held by a latch 2 section 8 and the path metric data held latches 1 5a and 5b should be outputted, respectively. Adders 3a and 3b add the branch metric data generated as described above and the path metric data outputted from the SW sections 2a to 2d, respectively.

Comparing and selecting sections 4a and 4b select the smaller one of the addition results and output the path metric data and path selection data, respectively. Latches 1 section 5a and 5b latch the path metric data outputted from the comparing and selecting sections 4a and 4b to adjust the output timing, respectively. The serial parallel (S/P) converting section 10 carries out a serial to parallel converting process to write the path selection data outputted from the comparing and selecting sections 4a and 4b in a path memory 11.

A data switching section 6 selects the path metric data outputted from the latch 1 sections 5a and 5b to be written in the path metric memory 7. The latch 2 section 8 reads and latches the path metric data from the path metric memory 7. An address generating section 9 generates read/write addresses for the path metric memory 7 and the path memory 11. A trace back section 12 carries out a trance back operation from the path memory 11 which stores the generated path selection data to generate Viterbi decode data. Also, a timing generating section 13 generates control timing signals to control the whole sections of the Viterbi decoder.

The Viterbi decoder in this embodiment is composed of α ACS units, each of which is composed of the switch sections 2a to 2d, the adding sections 3a and 3b, the comparing and selecting sections 4a and 4b, and the latch 1 sections 5a and 5b. The structures of the adding sections 3a and 3b and comparing and selecting sections 4a and 4b may be same as those of the conventional ACS circuit.

Next, the operation of this embodiment will be described with reference to FIG. 1 and FIGS. 2A to 2C, using as an example a case where a single ACS unit is present at the time of coding rate R=½ and restriction length K=9.

Because the restriction length K=9, there are 256 states of 0 to 255. In the ACS process, the following 0-th to fourth processes are repeated 64 times, to generate path metric data and path memory data in the states 0 to 255 at the time T+1 and time T+2. The ACS process for 2 symbols is carried out by repeating the following 0-th to fourth processes 64 times (x=0–63).

First, the path metric data at the time T to be used by the ACS unit are read out from the path metric memory 7 previously and the latch 2 section 8 holds the read out path metric data in the states 0+x, 128+x, 64+x, and 192+x.

<The 0-th process: Generation of branch metric data>

The branch metric generating section 1 inputs 2 demodulation symbols. With respect to the first symbol for the processes ① and ③ in the ACS process of FIGS. 2A to 2C, the branch metric generating section 1 generates branch metric data on the side of Z in the state 0+x, on the side of Z* in the state of 128+x, on the side of Z of state 64+x and on the side of Z* in the state 192+x at the time T.

Figure 2:
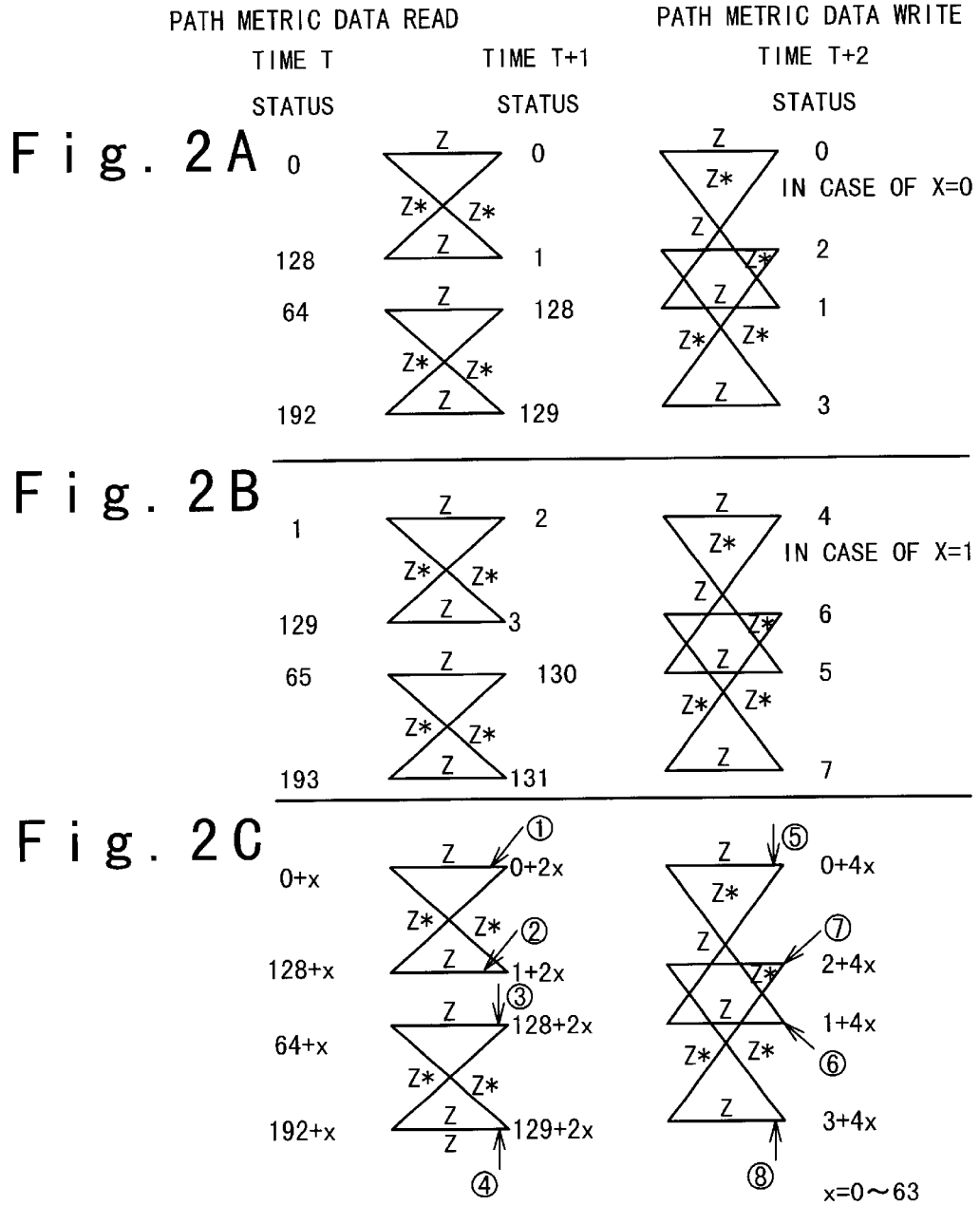
FIGS. 2A to 2C are state transition diagrams showing the process flow of an ACS unit.

At the next timing, for the processes ② and ④ in the ACS process of FIGS. 2A to 2C, the branch metric generating section 1 generates branch metric data on the side of Z* in the state 0+x, on the side of Z in the state 128+x, on the side of Z* in the state 64+x and on the side of Z in the state 192+x at the time T.

At the next timing, about the second symbol, for the processes ⑤ and ⑥ in the ACS process of FIGS. 2A to 2C, the branch metric generating section 1 generates branch metric data on the side of Z and the side of Z* in the state 0+x, and on the side of Z* and the side of Z in the state 128+x at the time T+1. At the next timing, for the processes ⑦ and ⑧ in the ACS process of FIGS. 2A to 2C, the branch metric generating section 1 generates branch metric data on the side of Z and the side of Z* in the state 1+x, and on side of Z* and the side of Z in the state 129+x at the time T+1.

<The first process: The process of ACS unit at the time T+1 on the side of Z>

The processes of ① and ③ in FIGS. 2A to 2C will be described.

The switch (SW) section 2a selects and outputs the path metric data A in the state 0+x at the time T outputted from the latch 2 section 8. The switch (SW) section 2b selects the path metric data B in the state 128+x at the time T in the same way. In the same way, the switch (SW) section 2c selects the path metric data C in the state 64+x at the time T and the switch (SW) section 2d selects the path metric data D in the state 192+x at the time T.

The adding section 3a adds the branch metric data on the side of Z in the state 0+x and the side of Z* in the state of 128+x at the time T which have been generated by the branch metric generating section 1 to the path metric data of states 0+x and 128+x at the time T inputted from the switch (SW) sections 2a and 2b. Also, the adding section 3b adds the branch metric data on the side of Z in the state of 64+x and the side of Z* in the state of 192+x at the time T which are generated by the branch metric generating section 1 to the path metric data of states 64+x and 192+x at the time T inputted from the switch (SW) sections 2c and 2d.

The comparing and selecting section 4a compares the path on the side of Z from the state 0+x and the path on the side of Z* from the state 128+x, selects the smaller one in the addition result and outputs the addition result for the selected path and path selection data. The comparing and selecting section 4b compares the path on the side of Z from the state 64+x and the path on the side of Z* from the state 192+x, selects the smaller one in the addition result and outputs the addition result for the selected path and path selection data.

The latch 1 section 5a latches and holds the selected path addition result as the path metric data in the state 0+x at the time T+1 and the latch 1 section 5b latches and holds the selected path addition result as the path metric data in the state 128+x at the time T+1.

<The second process: The process on the side of Z* of ACS unit at the time T+1>

The processes of ② and ④ of FIGS. 2A to 2C will be described.

The adding section 3a adds the branch metric data on the side of Z* in the state 0+x and the side of Z in the state 128+x at the time T which have been generated by the branch metric generating section 1 to the path metric data in the state 0+x and 128+x at the time T inputted from the switch (SW) sections 2a and 2b. Also, the adding section 3b adds the branch metric data on the side of Z* in the state 64+x and the side of Z in the state 192+x at the time T which have been generated by the branch metric generating section 1 to the path metric data in the state 64+x and 192+x at the time T inputted from the switch (SW) sections 2c and 2d.

The comparing and selecting section 4a compares the path on the side of Z* from the state 0+x and the path of the side of Z from the state 128+x, selects the smaller path in the addition result and outputs the addition result of the selected path and path selection data. The comparing and selecting section 4b compares the path on the side of Z* from the state 64+x and the path on the side of Z from the state 192+x, selects the smaller path in the addition result and outputs the addition result of the selected path and path selection data.

The latch 1 section 5a latches and holds the selected path addition result as the path metric data in the state 1+2x at the time T+1, and the latch 1 section 5b latches and holds the selected path addition result as the path metric data in the state 129+2x at the time T+1.

<The third process: The process of ACS unit on the smaller path side at the time T+2>

The processes of ⑤ and ⑥ of FIGS. 2A to 2C will be described.

The switch (SW) section 2a and the switch (SW) section 2c select the path metric data in the state 0+2x at the time T+1 inputted from the latch 1 section 5a. The switch (SW) section 2b and the switch (SW) section 2d select the path metric data in the state 128+2x at the time T+1 inputted from the latch 1 section 5b.

The adding section 3a adds the branch metric data on the side of Z in the state 0+2x and the side of Z* in the state 128+2x at the time T+1 which have been generated by the branch metric generating section 1 to the path metric data in the states 0+2x and 128+2x at the time T+1 inputted from the switch (SW) sections 2a and 2b. Also, the adding section 3b adds the branch metric data on the side of Z* in the state 0+2x and the side of Z in the state 128+2x at the time T+1 which have been generated by the branch metric generating section 1 to the path metric data in the state 0+2x and 128+2x at the time T+1 inputted from the switch (SW) section 2c and 2d.

The comparing and selecting section 4a compares the path on the side of Z from the state 0+2x and the path on the side of Z* from the state 128+2x, selects the smaller path of the addition results, and outputs the path metric data in the state 0+4x at the time T+2 and the path selection data. Also, the comparing and selecting section 4b compares the path on the side of Z* from the state 0+2x and the path on the side of Z from the state 128+2x, selects the smaller path of the addition results, and outputs the path metric data in the state 1+4x at the time T+2 and the path selection data.

The latch 1 section 5a latches the path metric data in the state 0+4x at the time T+2 and outputs to the data switching section 6. Also, the latch 1 section 5*b* latches the path metric data in the state 1+4x at the time T+2 and outputs to the data switching section 6.

<The fourth process: The calculation of the ACS unit on the larger path side at the time T+2>

The processes of ⑦ and ⑧ of FIGS. 2A to 2C will be described.

The switch (SW) section 2*a* and the switch (SW) section 2*c* select the path metric data in the state 1+2x at the time T+1 inputted from the latch 1 section 5*a*, and the switch (SW) section 2*b* and the switch (SW) section 2*d* select the path metric data in the state 129+2x at the time T+1 inputted from the latch 1 section 5*b*.

The adding section 3*a* adds the branch metric data on the side of Z in the state 1+2x and the side of Z* in the state 129+2x at the time T+1 which have been generated by the branch metric generating section 1 to the path metric data of 129+2x in the state 1+2x at the time T+1 inputted from the switch (SW) sections 2*a* and 2*b*. Also, the adding section 3*b* adds the branch metric on the side of Z* in the state 1+2x and the side of Z in the state 129+2x at the time T+1 which have been generated by the branch metric generating section 1 to the path metric data in the states 1+2x and 129+2x at the time T+1 inputted from the switch (SW) section 2*c* and 2*d*.

The comparing and selecting section 4*a* compares the path on the side of Z from the state 1+2x and the path on the side of Z* from the state 129+2x, selects the smaller path of the addition results and outputs the path metric data in the state 2+4x at the time T+2 and the path selection data. Also, the comparing and selecting section 4*b* compares the path on the side of Z* from the state 1+2x and the path on the side of Z from the state 129+2x, selects the smaller path of the addition results and outputs the path metric data in the state 3+4x at the time T+2 and the path selection data.

The latch 1 section 5*a* latches the path metric data in the state 2+4x at the time T+2 and outputs to the data switching section 6. Also, the latch 1 section 5*b* latches the path metric data in the state 3+4x at the time T+2 and outputs to the data switching section 6.

When the above 0-th to fourth processes end, the data switching section 6 switches the path metric data to be written into the path metric memory 7, between the path metric data in the state 0+4x at the time T+2 outputted from the latch 1 section 5*a* and the path metric data in the state 1+4x at the time T+2 outputted from the latch 1 section 5*b*. Also, the data switching section 6 switches the path metric data to be written into the path metric memory 7, between the path metric data in the state 2+4x at the time T+2 outputted from the latch 1 section 5*a* and the path metric data in the state 3+4x at the time T+2 outputted from the latch 1 section 5*b*.

The S/P converting section 10 inputs the path selection data at the time T+1 and T+2 which have been calculated through the above 0-th to fourth processes, carries out serial/parallel conversion to the path selection data and generates write data according to the format of the path memory 11.

The address generating section 9 carries out the generation of the write/read addresses to the path metric memory 7 and the write/read address to the path memory 11.

The timing generating section 13 generates the control timing signals which are used in the branch metric generating section 1, the SW sections 2*a* to 2*d*, the latch 1 sections 5*a* and 5*b*, the data switching section 6, the S/P converting section 10, the address generating section 9, the latch 2 section 8. Therefore, the timing generating section 13 has a counter for counting the value x=0 to 63 and a counter for counting the number of times of the decoding operation. If counting ½ of the preset number of symbols, the timing generating section 13 reads the path selection data stored in the path memory section 11, carries out a trace back operation, and outputs the Viterbi decode data, resulting in end.

It should be noted that when a ACS units are provided as in the first embodiment shown in FIG. 1, the (4×α) branch metric data are outputted from the branch metric generating section 1, and supplied to the respective ACS units. Also, the (4×α) path metric data are read out from the path metric memory 7 and latched and processed.

In this case, the path metric data outputted from each ACS unit are written into the path metric memory 7. Therefore, the path metric data to be written in a unit time increases to α times. Therefore, the path metric memory 7 is divided into 1/α to allow read/write in a time. Similarly, the path selection data outputted from the ACS unit increases to α times. Therefore, it is necessary to increase the serial parallel circuit in the S/P converting section 10 to write data into the path memory 11.

Figure 3:
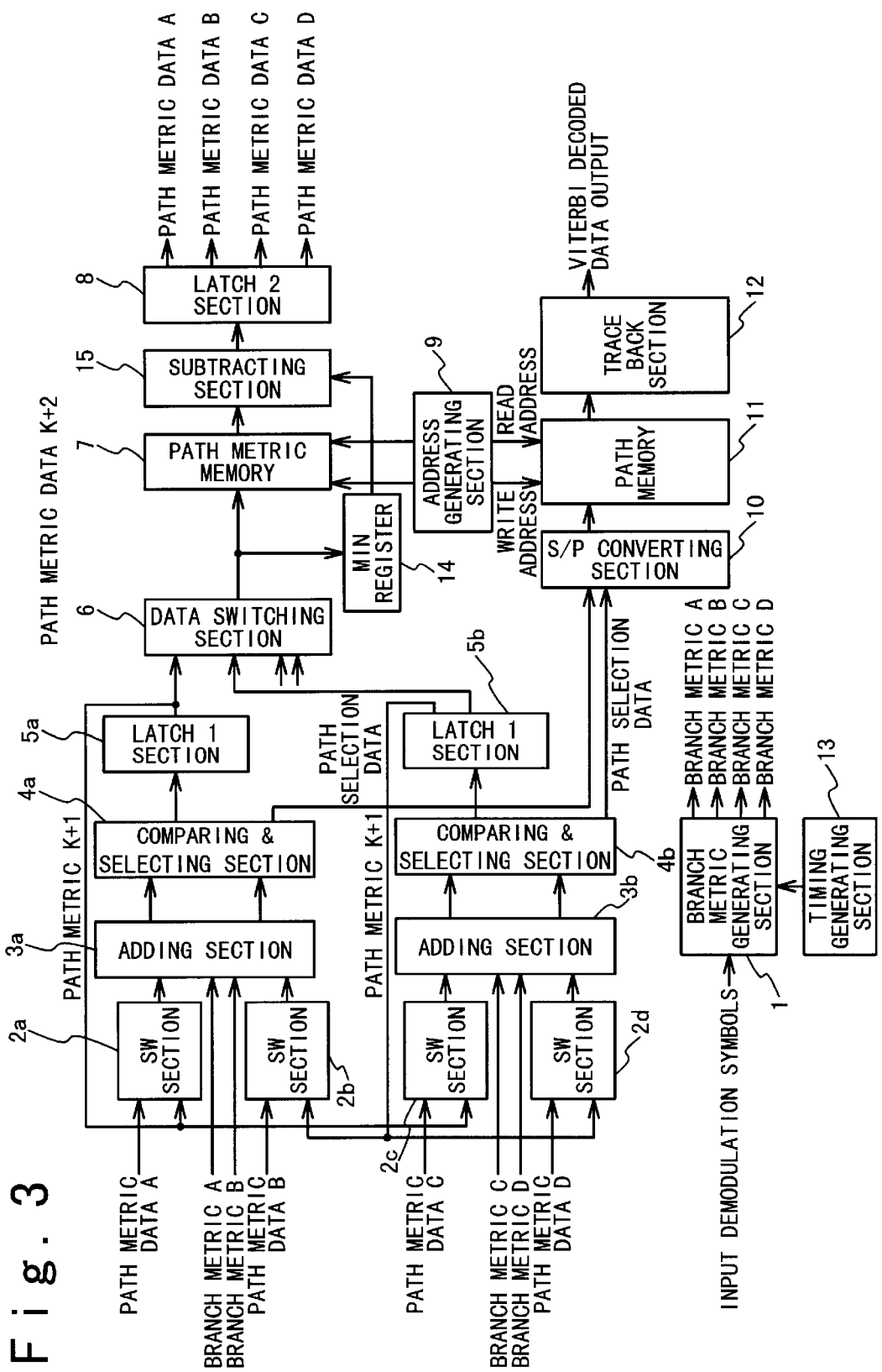
FIG. 3 is a block diagram showing the structure of a Viterbi decoder according to a second embodiment of the present invention.

FIG. 3 is a block diagram showing the second embodiment of the present invention. The second embodiment is different from the first embodiment in the point that a minimum value register 14 and a subtracting section 15 are added to the first embodiment of FIG. 1. The other components are same as those in the first embodiment of FIG. 1. Therefore, only the different parts will be described hereinafter, and the description of the same components as those of FIG. 1 is omitted.

In FIG. 3, the comparing and selecting circuits 4*a* and 4*b* select the smaller one of the inputted path metric data. The minimum value register 14 selects the smallest one from among the path metric data in the state 0 to state 255 outputted than the data switching section 6 and latches.

The subtracting section 15 reads out the path metric data from the path metric memory 7, subtracts the value of the minimum value register 14 from the read out path metric data and outputs the subtraction result to the latch 2 section 8. The switching of the minimum value register 14 is carried out when the path metric data in the state 0 is read out.

In this case, even if the value of the minimum value register is subtracted, the subtraction result is not used, when the entire read out path metric data are 1. The original data of all 1 is outputted. Thus, it is suppressed that the value of the path metric data becomes large, because the minimum value of the path metric data before 2 symbols is subtracted from the path metric data used by the ACS unit. Also, the minimum value register and the subtraction circuit may be applied to the first embodiment and the ACS unit may be provided for a plurality in the second embodiment.

In the present invention, the path metric data outputted from the ACS unit are used as the path metric data at the next time. Therefore, the number of times of the read operation of the path metric data from the path metric memory is reduced to a half, compared with the conventional Viterbi decoder. Also, the number of times of the write operation of the path metric data into the path metric memory is reduced to a half, compared with the conventional Viterbi decoder. Therefore, the accesses to the RAM are reduced to a half so that it is possible to decrease the power consumption.

Also, the number of times of the access to the path metric memory is a half. Also, the path metric data outputted from the ACS unit are inputted and used again. Therefore, the ACS units can be reduced to a half with the same throughput.

In other words, in the present invention, the path metric data are read out from the path metric memory at time T and the read out path metric data and the branch metrics at time T are added to each other in the ACS circuit. The addition results are compared to select one of them so that the path selection data and the path metric data at time T+1 are calculated. The path selection data at time T+1 is written in the path memory. However, the path metric data at time T+1 is not written in the path metric memory and supplied to the ACS circuit again.

Then, in the ACS circuit, the path metric data at time T+1 are added with the branch metrics at time T+1, and the addition results are compared to select one of them so that the path selection data and path metric data at time T+2 are calculated. The calculated path selection data and path metric data at time T+2 are written in the path memory and the path metric memory, respectively.

Therefore, in the path metric memory, the write operation and read operation of the path metric data at time T+1 can be omitted. Therefore, the number of times of access to the path metric memory can be reduced to a half, so that processing speed and the reduction of the power consumption can be attained.

What is claimed is:

1. A Viterbi decoder comprising:
  a branch metric generating section which generates branch metric data at times;
  a path metric memory which stores path metric data;
  a path memory which stores path selection data;
  an ACS (add compare and select) unit which calculates new path metric data from path metric data inputted thereto and said branch metric data at the times supplied from said branch metric generating section and determines path selection data for said new path metric data;
  a write section which writes said new path metric data and said path selection data in said path metric memory and said path memory, respectively; and
  a read section which reads out said path metric data from said path metric memory to output to said ACS unit;
  wherein said ACS unit inputs said path metric data, adds the inputted path metric data and said branch metric data at one of the times supplied from said branch metric generating section to produce temporal addition results, selects smaller one of the temporal addition results to latch the smaller temporal addition result as temporal path metric data, adds the temporal path metric data and the branch metric data at the next time supplied from said branch metric generating section to produce addition results, selects smaller one of the addition results, and latches and outputs the smaller addition result as said new path metric data and said path selection data for the new path metric data.

2. The Viterbi decoder according to claim 1, wherein said ACS unit inputs said path metric data at a time T of the times and said branch metric data at said time T to calculate temporal path metric data at a time T+1 of the times, and calculates said new path metric data at a time T+2 of the times from the temporal path metric data at said time T+1 and said branch metric data at said time T+1.

3. A Viterbi decoder comprising:
  a branch metric generating section which generates branch metric data at times;
  a path metric memory which stores path metric data;
  a path memory which stores path selection data;
  an ACS (add compare and select) unit which calculates new path metric data from path metric data inputted thereto and said branch metric data at the times supplied from said branch metric generating section and determines path selection data for said new path metric data;
  a write section which writes said new path metric data and said path selection data in said path metric memory and said path memory, respectively; and
  a read section which reads out said path metric data from said path metric memory to output to said ACS unit;
  wherein said ACS unit inputs said path metric data at a time T of the times and said branch metric data at said time T to calculate temporal path metric data at a time T+1 of the times, and calculates said new path metric data at a time T+2 of the times from the temporal path metric data at said time T+1 and said branch metric data at said time T+1;
  wherein said ACS unit comprises:
    a switch section which selects and outputs first one of said path metric data at said time T and first one of said temporal path metric data at said time T+1, selects and outputs second one of said path metric data at said time T and second one of said temporal path metric data at said time T+1, selects and outputs third one of said path metric data at said time T and said first temporal path metric data at said time T+1, and selects and outputs fourth one of said path metric data at said time T and said second temporal path metric data at said time T+1;
    an adding section which adds said first branch metric data at said time T and said first path metric data at said time T to produce a first addition result at said time T+1, adds said first branch metric data at said time T+1 and said first temporal path metric data at said time T+1 to produce a first addition result at said time T+2, adds said second branch metric data at said time T and said second path metric data at said time T to produce a second addition result at said time T+1, adds said second branch metric data at said time T+1 and said second temporal path metric data at said time T+1 to produce a second addition result at said time T+2, adds said third branch metric data at said time T and said third path metric data at said time T to produce a third addition result at said time T+1, adds said third branch metric data at said time T+1 and said first temporal path metric data at said time T+1 to produce a third addition result at said time T+2, adds said fourth branch metric data at said time T and said fourth path metric data at said time T to produce a fourth addition result at said time T+1, and adds said fourth branch metric data at said time T+1 and said second temporal path metric data at said time T+1 to produce a fourth addition result at said time T+2;
    a selecting section which selects a first smaller one of said first and second addition results at said time T+1, selects a second smaller one of said third and fourth addition results at said time T+1, and selects a first smaller one of said first and second addition results at said time T+2 and outputs a first one of said path selection data for the first smaller addition result at said time T+2, selects a second smaller one of said third and fourth addition results at said time T+2 and outputs a second one of said path selection data for the second smaller addition result at said time T+2; and
    a latch section which latches said first smaller addition result at said time T+1 as said first temporal path metric data, and said second smaller addition result at said time T+1 as said second temporal path metric data, and latches said first smaller addition result at said time T+2 as a first one of said new path metric data, and said second smaller addition result at said time T+2 as a second one of said new path metric data.

4. A Viterbi decoder comprising:
a branch metric generating section which generates branch metric data at times;
a path metric memory which stores path metric data;
a path memory which stores path selection data;
an ACS (add compare and select) unit which calculates new path metric data from path metric data inputted thereto and said branch metric data at the times supplied from said branch metric generating section and determines path selection data for said new path metric data;
a write section which writes said new path metric data and said path selection data in said path metric memory and said path memory, respectively; and
a register which latches the smallest one of elements of said new path metric data for states determined based on a restriction length; and
a subtracting section which subtracts a value of said smallest element from each of elements of said path metric data read out from said path metric memory.

5. The Viterbi decoder according to claim 1, further comprising:
a plurality of said ACS units, and
wherein said write section writes said new path metric data and said path selection data from each of said plurality of ACS units in said path metric memory and said path memory, respectively.

6. A method of Viterbi-decoding demodulation data, comprising:
(a) generating branch metric data at times from demodulation data;
(b) calculating new path metric data from path metric data and said generated branch metric data at the times and determining path selection data for said new path metric data;
(c) writing said new path metric data and said path selection data in a path metric memory and a path memory, respectively; and
(d) reading out said path metric data from said path metric memory for said calculating (b) of a next process;
wherein said calculating (b) comprises:
(e) adding said path metric data and said branch metric data at one of the times to produce temporal addition results;
(f) selecting smaller one of the temporal addition results to latch the smaller temporal addition result as temporal path metric data;
(g) adding said temporal path metric data and said branch metric data at the next time to produce addition results;
(h) selecting smaller one of the addition results; and
(i) latching the smaller addition result as said new path metric data and said path selection data for the new path metric data.

7. The method according to claim 6, wherein said calculating (b) comprises:
(j) calculating temporal path metric data at a time T+1 of the times from said path metric data at a time T of the times and said branch metric data at said time T; and
(k) calculating said new path metric data at a time T+2 of the times from the temporal path metric data at said time T+1 and said branch metric data at said time T+1.

8. A method according of Viterbi-decoding demodulation data comprising:
(a) generating branch metric data at times from demodulation data;
(b) calculating new path metric data from path metric data and said generated branch metric data at the times and determining path selection data for said new path metric data,
(c) writing said new path metric data and said path selection data in a path metric memory and a path memory, respectively; and
(d) reading out said path metric data from said path metric memory for said calculating (b) of a next process;
wherein said calculating (b) includes:
(e) calculating temporal path metric data at a time T+1 of the times from said path metric data at a time T of the times and said branch metric data at said time T; and
(f) calculating said new path metric data at a time T+2 of the times from the temporal path metric data at said time T+1 and said branch metric data at said time T+1; and
wherein said calculating (e) includes:
(g) selecting first one of said path metric data at said time T, second one of said path metric data at said time T, third one of said path metric data at said time T, and fourth one of said path metric data at said time T;
(h) adding said first branch metric data at said time T and said first path metric data at said time T to produce a first addition result at said time T+1, adding said second branch metric data at said time T and said second path metric data at said time T to produce a second addition result at said time T+1, adding said third branch metric data at said time T and said third path metric data at said time T to produce a third addition result at said time T+1, and adding said fourth branch metric data at said time T and said fourth path metric data at said time T to produce a fourth addition result at said time T+1;
(i) selecting a first smaller one of said first and second addition results at said time T+1, and selecting a second smaller one of said third and fourth addition results at said time T+1; and
(j) latching said first smaller addition result at said time T+1 as said first one of said temporal path metric data, and said second smaller addition result at said time T+1 as said second one of said temporal path metric data.

9. The method according to claim 8, wherein said calculating (f) includes:
(k) selecting first one of said temporal path metric data at said time T+1, second one of said temporal path metric data at said time T+1, said first temporal path metric data at said time T+1, and said second temporal path metric data at said time T+1;
(l) adding said first branch metric data at said time T+1 and said first temporal path metric data at said time T+1 to produce a first addition result at said time T+2, adding said second branch metric data at said time T+1 and said second temporal path metric data at said time T+1 to produce a second addition result at said time T+2, adding said third branch metric data at said time T+1 and said first temporal path metric data at said time T+1 to produce a third addition result at said time T+2, and adding said fourth branch metric data at said time T+1 and said second temporal path metric data at said time T+1 to produce a fourth addition result at said time T+2;

(m) selecting a first smaller one of said first and second addition results at said time T+2 and outputs a first one of said path selection data for the first smaller addition result at said time T+2, and selecting a second smaller one of said third and fourth addition results at said time T+2 and outputs a second one of said path selection data for the second smaller addition result at said time T+2; and (n) latching said first smaller addition result at said time T+2 as a first one of said new path metric data, and said second smaller addition result at said time T+2 as a second one of said new path metric data.

10. The method according to claim 6, further comprising:

latching the smallest one of elements of said new path metric data for states determined based on a restriction length; and subtracting a value of said smallest element from each of elements of said path metric data read out from said path metric memory.

11. The method according to claim 6, wherein said writing (c) includes:

writing said new path metric data and said path selection data generated by a plurality of ACS units through said calculating (b) in said path metric memory and said path memory, respectively.

* * * * *